United States Patent
Mrzyglod et al.

(10) Patent No.: US 9,818,618 B2
(45) Date of Patent: Nov. 14, 2017

(54) MULTI-LAYER POLISHING PAD FOR CMP

(71) Applicant: Cabot Microelectronics Corporation, Aurora, IL (US)

(72) Inventors: Brian Mrzyglod, Elburn, IL (US); Jayakrishnan Nair, Naperville, IL (US); Garrett Blake, Naperville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 14/700,580

(22) Filed: Apr. 30, 2015

(65) Prior Publication Data

US 2015/0325451 A1  Nov. 12, 2015

Related U.S. Application Data

(60) Provisional application No. 61/989,669, filed on May 7, 2014, provisional application No. 62/022,770, filed on Jul. 10, 2014.

(51) Int. Cl.
*B24B 37/22* (2012.01)
*H01L 21/306* (2006.01)
*B24D 11/00* (2006.01)
*B24B 37/04* (2012.01)
*B24B 37/24* (2012.01)
*B24D 18/00* (2006.01)

(52) U.S. Cl.
CPC ...... *H01L 21/30625* (2013.01); *B24B 37/042* (2013.01); *B24B 37/22* (2013.01); *B24B 37/24* (2013.01); *B24D 11/00* (2013.01); *B24D 11/001* (2013.01); *B24D 18/0045* (2013.01)

(58) Field of Classification Search
CPC  B24B 5/047; B24B 7/228; B24B 7/24; B24B 7/241; B24B 37/04; B24B 37/942; B24B 37/22; B24B 37/24; B24B 41/06; B24B 41/061; B24D 18/0045
See application file for complete search history.

(56) References Cited

U.S. PATENT DOCUMENTS

| | | |
|---|---|---|
| 5,196,353 A | 3/1993 | Sandhu et al. |
| 5,257,478 A | 11/1993 | Hyde et al. |
| 5,433,651 A | 7/1995 | Lustig et al. |
| 5,609,511 A | 3/1997 | Moriyama et al. |
| 5,643,046 A | 7/1997 | Katakabe et al. |
| 5,658,183 A | 8/1997 | Sandhu et al. |

(Continued)

OTHER PUBLICATIONS

Korean Intellectual Property Office, The International Search Report and the Written Opinion of the International Searching Authority, issued in connection with International Patent Application No. PCT/US2015/028503 dated Jul. 30, 2015.

*Primary Examiner* — Timothy V Eley
(74) *Attorney, Agent, or Firm* — Thomas Omholt; Erika S. Wilson

(57) ABSTRACT

The invention is directed to a multi-layer polishing pad for chemical-mechanical polishing comprising a top layer, a middle layer and a bottom layer, wherein the top layer and bottom layer are joined together by the middle layer, and without the use of an adhesive. The invention is also directed to a multi-layer polishing pad comprising an optically transmissive region, wherein the layers of the multi-layer polishing pad are joined together without the use of an adhesive.

17 Claims, 3 Drawing Sheets

(56) References Cited

U.S. PATENT DOCUMENTS

| | | | |
|---|---|---|---|
| 5,730,642 A | 3/1998 | Sandhu et al. | |
| 5,838,447 A | 11/1998 | Hiyama et al. | |
| 5,872,633 A | 2/1999 | Holzapfel et al. | |
| 5,893,796 A | 4/1999 | Birang et al. | |
| 5,949,927 A | 9/1999 | Tang | |
| 5,964,643 A | 10/1999 | Birang et al. | |
| 9,162,340 B2* | 10/2015 | Joseph | B24B 37/22 |
| 2004/0259484 A1* | 12/2004 | Prasad | B24D 3/32 451/287 |
| 2007/0015448 A1* | 1/2007 | Swisher | B24B 37/22 451/526 |
| 2008/0274674 A1* | 11/2008 | Prasad | B24B 37/22 451/60 |
| 2011/0045753 A1* | 2/2011 | Shiro | B24B 37/22 451/540 |
| 2013/0102231 A1* | 4/2013 | Joseph | B24B 37/22 451/59 |
| 2013/0324020 A1* | 12/2013 | Lefevre | B24B 37/205 451/529 |
| 2015/0273656 A1* | 10/2015 | Allison | B24B 37/16 451/527 |

\* cited by examiner

MULTI-LAYER POLISHING PAD FOR CMP

CROSS-REFERENCE TO RELATED APPLICATIONS

This patent application claims the benefit of U.S. Provisional Patent Application 62/022,770, filed Jul. 10, 2014, and U.S. Provisional Patent Application No. 61/989,669, filed May 7, 2014, which are incorporated by reference in their entireties herein.

BACKGROUND OF THE INVENTION

Chemical-mechanical polishing ("CMP") processes are used in the manufacturing of microelectronic devices to form flat surfaces on semiconductor wafers, field emission displays, and many other microelectronic substrates. For example, the manufacture of semiconductor devices generally involves the formation of various process layers, selective removal or patterning of portions of those layers, and deposition of yet additional process layers above the surface of a semiconducting substrate to form a semiconductor wafer. The process layers can include, by way of example, insulation layers, gate oxide layers, conductive layers, and layers of metal or glass, etc. It is generally desirable in certain steps of the wafer process that the uppermost surface of the process layers be planar, i.e., flat, for the deposition of subsequent layers. CMP is used to planarize process layers wherein a deposited material, such as a conductive or insulating material, is polished to planarize the wafer for subsequent process steps.

In a typical CMP process, a wafer is mounted upside down on a carrier in a CMP tool. A force pushes the carrier and the wafer downward toward a polishing pad. The carrier and the wafer are rotated above the rotating polishing pad on the CMP tool's polishing table. A polishing composition (also referred to as a polishing slurry) generally is introduced between the rotating wafer and the rotating polishing pad during the polishing process. The polishing composition typically contains a chemical that interacts with or dissolves portions of the uppermost wafer layer(s) and an abrasive material that physically removes portions of the layer(s). The wafer and the polishing pad can be rotated in the same direction or in opposite directions, whichever is desirable for the particular polishing process being carried out. The carrier also can oscillate across the polishing pad on the polishing table. CMP polishing pads often comprise two or more layers, for example a polishing layer and a bottom (e.g., subpad) layer, which are joined together through the use of an adhesive, such as a hot-melt adhesive or a pressure-sensitive adhesive. Such a multi-layer polishing pad is disclosed, for example, in U.S. Pat. No. 5,257,478.

Prior art polishing pads that rely on adhesives to join together polishing pad layers or to affix windows within the polishing pad have many disadvantages. For example, the adhesives often have harsh fumes associated with them and typically require curing over 24 hours or more. Moreover, the adhesive can be susceptible to chemical attack from the components of the polishing composition, and so the type of adhesive used in joining pad layers or attaching a window to the pad has to be selected on the basis of what type of polishing system will be used. Furthermore, the bonding of the pad layers or windows to the polishing pad is sometimes imperfect or degrades over time. This can result in delamination and buckling of the pad layers and/or leakage of the polishing composition between the pad and the window. In some instances, the window can become dislodged from the polishing pad over time. Methods for forming integrally molded polishing pad windows can be successful in avoiding at least some of these problems, but such methods are often costly and are limited in the type of pad materials that can be used and the type of pad construction that can be produced.

Thus, there remains a need for effective multi-layer polishing pads and polishing pads comprising translucent regions (e.g., windows) that can be produced using efficient and inexpensive methods without relying on the use of an adhesive. The invention provides such polishing pads, as well as methods of their use. These and other advantages of the present invention, as well as additional inventive features, will be apparent from the description of the invention provided herein.

BRIEF SUMMARY OF THE INVENTION

The invention provides a multi-layer polishing pad for use in chemical-mechanical polishing. The polishing pad comprises a top layer, a middle layer and a bottom layer, wherein the top layer and the bottom layer are bonded together by the middle layer, and wherein the layers are bonded without the use of an adhesive.

The invention also provides a multi-layer polishing pad comprising an optically transmissive region, the pad comprising a top layer, a middle layer and a bottom layer, and the layers are joined together without the use of an adhesive.

The invention further provides methods for producing a polishing pad of the invention. A first method comprises (i) joining together multiple layers of polymeric materials, wherein the multiple layers comprise a top layer, a middle layer and a bottom layer, wherein the middle layer comprises a polymer resin having lower Vicat softening temperature as compared to the top layer and the bottom layer, (ii) subjecting the multi-layer polymer sheet to a temperature that is above the Vicat softening temperature of the middle layer but below the Vicat softening temperature of the top layer and the bottom layer, and (iii) forming a bond between the middle layer and the top layer, and a bond between the middle layer and the bottom layer.

A second method comprises (i) joining together multiple layers of polymeric materials, wherein the multiple layers comprise a top layer, a middle layer and a bottom layer, and wherein the middle layer is a thermoplastic polyurethane having a lower Vicat softening temperature than either the top layer or the bottom layer, (ii) subjecting the multi-layer polymer sheet to a temperature that is above the Vicat softening temperature of the middle layer but below the Vicat softening temperature of the top layer and the bottom layer, and (iii) forming a bond between the middle layer and the top layer, and a bond between the middle layer and the bottom layer.

The invention further provides methods for polishing a workpiece comprising (a) providing the polishing pad of the present invention, (b) contacting a workpiece with the polishing pad, and (c) moving the polishing pad relative to the workpiece to abrade the workpiece and thereby polishing the workpiece.

BRIEF DESCRIPTION OF THE SEVERAL VIEWS OF THE DRAWING(S)

FIG. 1 schematically depicts a lamination process for producing pads of the present invention.

FIG. 2a and FIG. 2b schematically depict a two-step lamination process for producing pads of the present invention.

DETAILED DESCRIPTION OF THE INVENTION

Figure 1:
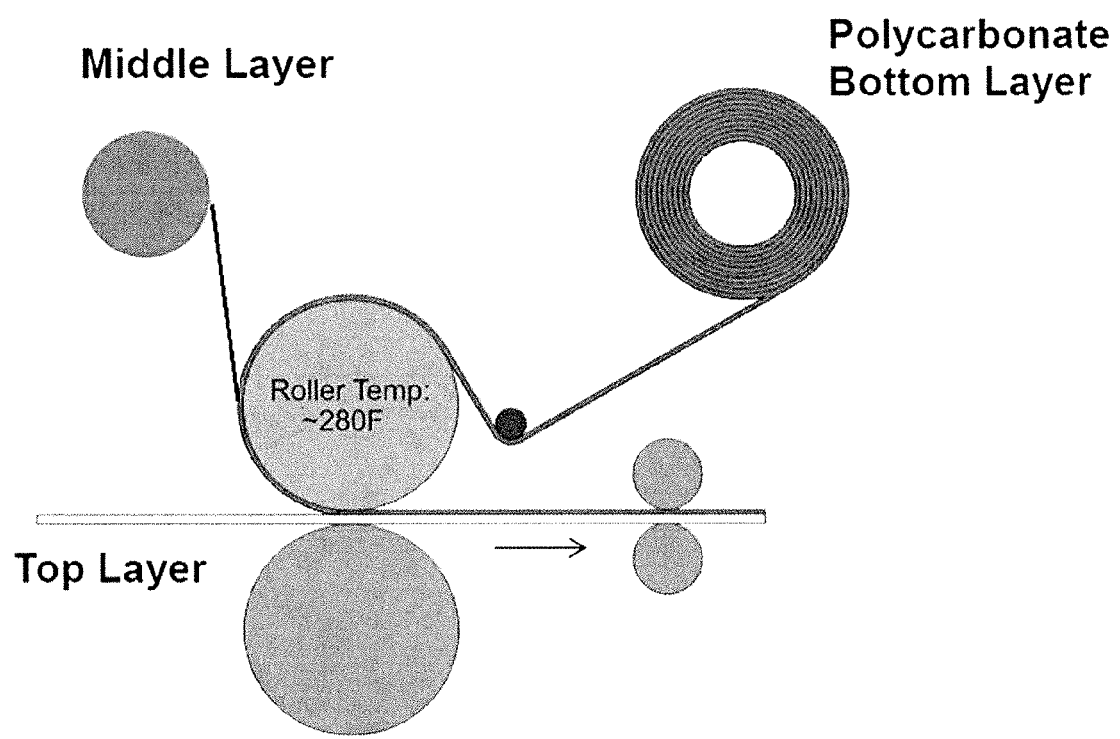

The invention is directed to a polishing pad comprising a top layer, a middle layer and a bottom layer, wherein the top layer and the bottom layer are bonded together by the middle layer, and wherein the layers are bonded without the use of an adhesive. In a first embodiment, the multi-layer polishing pad material is used as a multi-layer polishing pad. In a second embodiment, the multi-layer polishing pad material is used as an optically transmissive region within a polishing pad.

The layers of the polishing pad material do not contain any adhesive between the layers. Adhesive refers to any of the common adhesive materials known in the art, for example, hot melt adhesives, pressure sensitive adhesives, glues, and the like. Rather, the top layer and the bottom of the polishing pad are joined together by the middle layer. Desirably, the layers are substantially coextensive.

The advantage of such multi-layer polishing pad material is that each of the layers can have different physical or chemical properties. For example, in some applications it may be desirable for each of the layers to have the same polymer composition but have different physical properties such as hardness, density, porosity, compressibility, rigidity, tensile modulus, bulk modulus, rheology, creep, glass transition temperature, melt temperature, viscosity, or transparency. Of course, the polishing pad layers can have different chemical properties as well as different physical properties. Preferably, the layers of the polishing pad material will have at least one different chemical or physical property.

Another advantage of the multi-layer polishing pad of the present invention is that the bonding of the top layer with the bottom layer, via the middle layer, allows for a much stronger bond as compared to bonds using adhesives. The present inventive pad is more resistant to failure from high temperatures, as compared to pads having their layers bonded together with the use of adhesives.

Desirably, the top layer of the polishing pad material comprises a polymer resin. The polymer resin can be any suitable polymer resin. Typically, the polymer resin is selected from the group consisting of thermoplastic elastomers, thermoset polymers, polyurethanes (e.g., thermoplastic polyurethanes), polyolefins (e.g., thermoplastic polyolefins), polycarbonates, polyvinylalcohols, nylons, elastomeric rubbers, elastomeric polyethylenes, polytetrafluoroethylenes, polyethyleneterephthalates, polyimides, polyaramides, polyarylenes, polyacrylates, polystyrenes, polymethylmethacrylates, copolymers thereof, and mixtures thereof. Preferably, the polymer resin for the top layer comprises a thermoplastic polyurethane.

The top layer of the polishing pad can be hydrophilic, hydrophobic, or a combination thereof. The hydrophilicity/hydrophobictiy of the top layer is determined largely by type of polymer resin used to make the layer. Polymer resins having a critical surface tension of about 34 milliNewtons per meter (mN/m) or greater generally are considered hydrophilic, while polymer resins having a critical surface tension of about 33 nM/m or less are generally considered hydrophobic. The critical surface tension of some common polymer resins are as follows (value shown in parentheses): polytetrafluoroethylene (19), polydimethylsiloxane (24), silicone rubber (24), polybutadiene (31), polyethylene (31), polystyrene (33), polypropylene (34), polyester (39-42), polyacrylamide (35-40), polyvinyl alcohol (37), polymethyl methacrylate (39), polyvinyl chloride (39), polysulfone (41), nylon 6 (42), polyurethane (45), and polycarbonate (45). Typically, the top layer of the polishing pad is hydrophilic. Preferably the top layer is hydrophilic.

The top layer of the polishing pad can have any suitable hardness (e.g., about 30-50 Shore A or about 25-80 Shore D. For example, the top layer can have a hardness range from a Shore A hardness of 55 to a Shore D hardness of 72, both as measured according to ASTM D2240-10. Similarly, the top layer can have any suitable density and/or porosity. For example, the top layer can be nearly solid (e.g., having less than about 10% void volume), or porous, and can have a density of about 0.3 g/cm$^3$ or higher (e.g., about 0.5 g/cm$^3$ or higher, or about 0.7 g/cm$^3$ or higher) or even about 0.9 g/cm$^3$ (e.g., about 1.1 g/cm$^3$, or up to about 99% of the theoretical density of the material).

It will be understood that grooves in various arrangements can optionally be included over portions or over the entire polishing surface of the top layer. For example, grooves of desired pattern and dimension can be cut, particularly on the polishing side of the top layer of the polishing pad at depth to facilitate the distribution of slurry during polishing on the polishing surface of the pad substrate, in some embodiments. For example, grooves can be crosshatched in an X-Y pattern, concentric, spiral, off-set concentric, etc. Other suitable surface groove patterns can be readily utilized. Furthermore, grooves can be of any suitable dimensions.

The middle layer can comprise any suitable polymer resin having lower Vicat softening temperature as compared to the top layer and the bottom layer. For example, the middle layer can comprise a thermoplastic polyurethane or a thermoset polyurethane. One preferred polishing pad material comprises a thermoplastic polyurethane having a melt temperature lower than the top layer and the bottom layer. Specifically, the preferred thermoplastic polyurethane will have a lower Vicat softening temperature as compared to the top layer and the bottom layer. The Vicat softening temperature can be determined according to the test described in ASTM D1525 (2006). The Vicat softening temperature is the temperature at which a 1 mm$^2$ flat-ended needle penetrates a sample to a 1 mm depth under a specific load at a specific heating rate. The Vicat softening temperature can be used to predict at what point a material will soften when exposed to high temperatures. The Vicat softening temperature of the middle layer is preferably about 5° F. to about 15° F. below the Vicat softening temperature of the top layer and the bottom layer. For example, if the top layer and bottom layer had Vicat softening temperatures of approximately 265° F., the Vicat softening temperature of the middle layer would be approximately 250 to 260° F.

The middle layer can be of any suitable thickness. For example, the middle layer may have a thickness of about 3 mil or greater, such as 4 mil or greater. The middle layer may not be too thin from a standpoint of not sufficiently bonding the top layer and the bottom layer together. For example, a middle layer of 2 mil or less would not be preferred.

The middle layer may have any suitable hardness. For example, the middle layer may have a Shore A hardness of 55 to a Shore D hardness of 40, both as measured according to ASTM D2240-10. In one embodiment, the middle layer has a Shore A hardness of from about 57 to about 90.

The bottom layer may comprise any suitable material. Suitable materials for the bottom layer include polyurethane foam (e.g., foam subpads from Rogers Corporation, Rogers, Conn.), impregnated felt, microporous polyurethane, or sintered urethane. The bottom layer may be softer than the top layer of the invention, and therefore may be more compressible and have a lower Shore hardness value than the polishing pad of the invention. For example, the bottom layer can have a Shore A hardness of about 35 to about 50. In some embodiments, the bottom layer is harder, is less compressible, and has a higher Shore hardness than the top layer. The bottom layer optionally comprises grooves, channels, hollow sections, windows, apertures, and the like. The bottom layer preferably comprises a polycarbonate or thermoset polyurethane material. One example of a preferred thermoset polyurethane is a porous thermoset polyurethane.

The top and bottom layers of the polishing pad can have any suitable thickness. The thickness of each layer will depend in part on the total desired thickness of the polishing pad. Moreover, the top and bottom layers of the polishing pad can have the same thickness, or the layers can each have a different thickness.

When the multi-layer polishing pad of the present invention is used in conjunction with an in situ endpoint detection system, it may be desirable for at least one layer of the multi-layer polishing pad to have a transmittance to light (e.g., laser light) of about 10% or more (e.g., about 20% or more, or about 30% or more) at at least one wavelength between about 200 nm and about 10,000 nm (e.g., about 200 nm to about 1,000 nm, or about 200 nm to about 800 nm). For example, the top layer and the middle layer can be substantially opaque and the bottom layer can be optically transmissive. In order to use such a polishing pad with an in situ endpoint detection system, a portion of the polishing layer is removed to produce an aperture in the polishing layer which reveals a region of the substantially optically transmissive bottom layer. The optically transmissive region of the bottom layer revealed by the aperture in the top layer is thus recessed from the polishing surface so as to protect the "window" from becoming scratched by the polishing composition during a polishing process. In the case of an optically transmissive polishing layer and a substantially opaque middle layer and bottom layer, a portion of the bottom layer is removed to produce an aperture in the bottom layer, which reveals a region of the substantially optically transmissive polishing layer. Other designs for an in situ endpoint detection system may be used, for example, where the "window" spans the three layers. In this embodiment, the multi-layer polishing pad further comprises one or more optically transmissive windows that are inserted into an aperture cut into the polishing pad (e.g., in at least one of the top layer, middle layer, and bottom layer, but preferably all three layers). Desirably, the window is bonded to the polishing pad by a means other than the use of an adhesive. For example, the window may be attached to the polishing pad by a welding technique, for example, ultrasonic welding.

The multi-layer polishing pad of the first embodiment can have any suitable dimensions. Typically, the multi-layer polishing pad will have a thickness of about 500 μm or more (e.g., 750 μm or more, or about 1000 μm or more). The multi-layer polishing pad desirably is circular in shape (as is used in rotary polishing tools) or is produced as a looped linear belt (as is used in linear polishing tools). The polishing layer of the multi-layer polishing pad optionally further comprises grooves, perforations, channels, or other such patterns, which facilitate the flow of polishing composition across the surface of the polishing pad. The grooves, channels, etc, can be in the shape of concentric circles, spirals, XY crosshatch patterns, or any other suitable pattern.

The polishing pads of the invention are particularly suited for use in conjunction with a chemical-mechanical polishing (CMP) apparatus. Typically, the apparatus comprises a platen, which, when in use, is in motion and has a velocity that results from orbital, linear, or circular motion, a polishing pad of the invention in contact with the platen and moving with the platen when in motion, and a carrier that holds a workpiece to be polished by contacting and moving relative to the surface of the polishing pad. The polishing of the workpiece takes place by the workpiece being placed in contact with the polishing pad and then the polishing pad moving relative to the workpiece, typically with a polishing composition therebetween, so as to abrade at least a portion of the workpiece to polish the workpiece. The polishing composition typically comprises a liquid carrier (e.g., an aqueous carrier), a pH adjustor, and optionally an abrasive. Depending on the type of workpiece being polished, the polishing composition optionally may further comprise oxidizing agents, organic acids, complexing agents, pH buffers, surfactants, corrosion inhibitors, anti-foaming agents, and the like. The CMP apparatus can be any suitable CMP apparatus, many of which are known in the art. The polishing pad of the invention also can be used with linear polishing tools.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. Nos. 5,196,353, 5,433,651, 5,609,511, 5,643,046, 5,658,183, 5,730,642, 5,838,447, 5,872,633, 5,893,796, 5,949,927, and 5,964,643. Desirably, the inspection or monitoring of the progress of the polishing process with respect to a workpiece being polished enables the determination of the polishing end-point, i.e., the determination of when to terminate the polishing process with respect to a particular workpiece.

The polishing pads comprising the multi-layer polishing pad material of the invention are suitable for use in polishing many types of workpieces (e.g., substrates or wafers) and workpiece materials. For example, the polishing pads can be used to polish workpieces including memory storage devices, semiconductor substrates, and glass substrates. Suitable workpieces for polishing with the polishing pads include memory or rigid disks, magnetic heads, MEMS devices, semiconductor wafers, field emission displays, and other microelectronic substrates, especially microelectronic substrates comprising insulating layers (e.g., silicon dioxide, silicon nitride, or low dielectric materials) and/or metal-containing layers (e.g., copper, tantalum, tungsten, aluminum, nickel, titanium, platinum, ruthenium, rhodium, iridium or other noble metals).

The multi-layer polishing pad material of the invention can be prepared by any suitable method. One suitable method involves joining together the layers of the polishing pad material by contacting the coextensive faces of the layers while at least the middle layer is above the Vicat softening temperature, and applying pressure. The temperature of the layers can be increased by any suitable means. For example, the bonds between the polishing pad layers can be produced by welding (e.g., ultrasonic welding), thermal bonding, radiation-activated bonding, or lamination. A preferred method is lamination. As used in the present invention, lamination involves the bonding of three or more layers using heat and pressure.

The lamination method of the present invention generally involves heating and pressing the top layer, the middle layer and the bottom layer together at a sufficient temperature (above the Vicat softening temperature of the middle layer) that causes the middle layer to soften and to form bonds with the top and bottom layers. In one embodiment, this method involves subjecting one or both faces of the middle layer polymer to a temperature above the $T_g$ of the polymer, such that the polymer begins to flow and fill in void spaces of the adjoining layers (i.e. the top layer and the bottom layer). Using these techniques, a three-layer polishing pads having a thin, solid middle layer, a porous top layer and a porous or non-porous bottom layer, can be produced.

In one embodiment for preparing the inventive multi-layer polishing pad, the multi-layer polishing pad comprises a porous top layer of thermoplastic polyurethane, a middle layer of thermoplastic polyurethane, and a bottom layer comprising polycarbonate. FIG. 1 depicts a process for producing the multi-layer polishing pad of the first embodiment. In FIG. 1 a roll of polycarbonate (PC) material of is loaded on an upper un-wind station of a laminator. A roll of thermoplastic polyurethane is loaded on the lower un-wind for the middle layer. Not shown in this figure is the un-wind station for the thermoplastic polyurethane (top layer). The three materials are joined together in the heated nip. The top roller in the nip is heated to 180° F. The resulting stacked material is collected on a rear re-wind station (not shown) creating a roll of a laminated sheet with three layers, which will be used to form a multi-layer polishing pad.

Figure 2A:
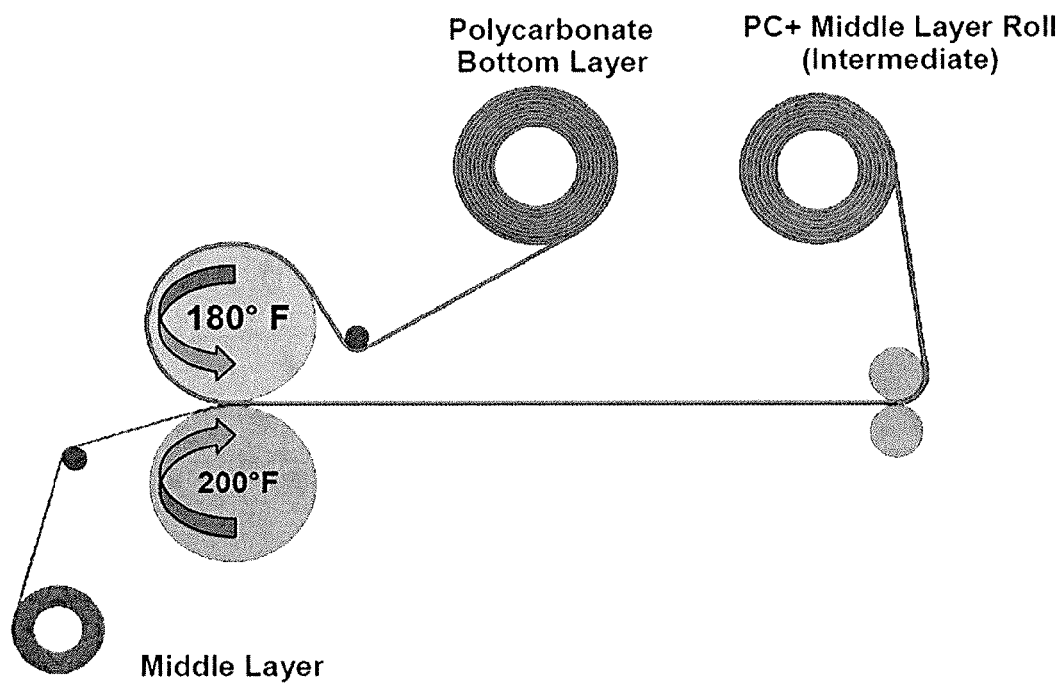
Figure 2B:
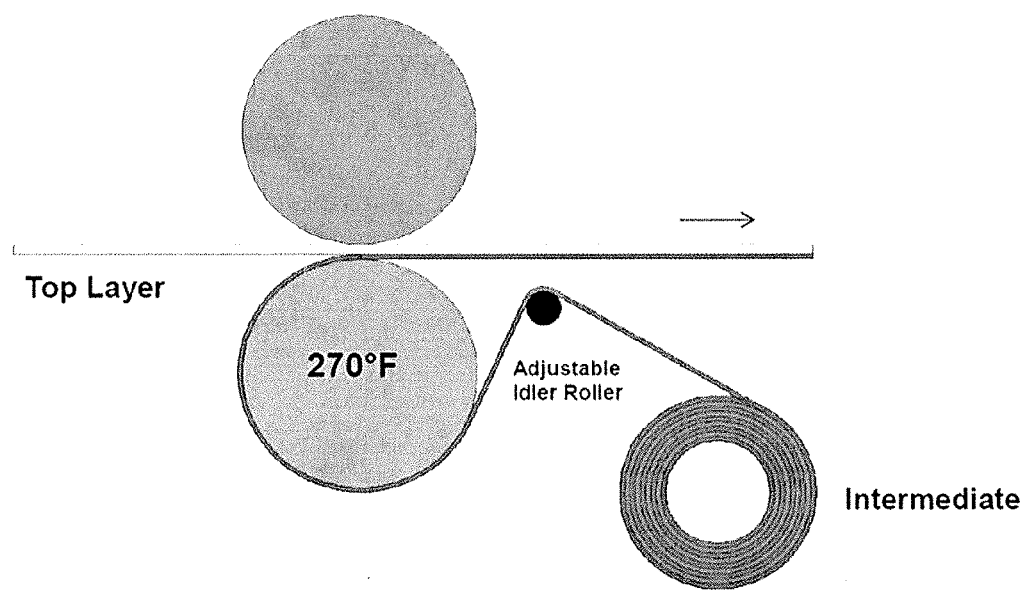

In a second embodiment, the multi-layer polishing pad comprising a porous top layer of thermoplastic polyurethane, a middle layer of thermoplastic polyurethane, and a bottom layer comprising polycarbonate, is produced in a two-step process. FIG. 2a and FIG. 2b depict a two-step process for producing the inventive multi-layer polishing pad. In FIG. 2a, a roll of polycarbonate (PC) material is loaded on the upper un-wind station of a laminator. A roll of the middle layer material is loaded on the lower un-wind. Both materials are joined together in the heated nip. The top roller is heated to 180° F. and the bottom roller is heated to 200° F. The resulting stacked intermediate material is collected on the rear re-wind station creating a roll of polycarbonate material laminated with the middle layer material. In FIG. 2b the intermediate material from step one is then loaded on the un-wind cart of the laminator. The material is webbed such that the polycarbonate side is contacting the bottom roller and the intermediate layer will contact the top layer material under the nip. The bottom roller is heated to 270° F., and heat is transferred through the polycarbonate, heating the intermediate layer causing it to flow. As the top layer material is fed into the nip the softened intermediate layer bonds the top layer material and the bottom layer polycarbonate material together.

Once the layers are joined together by either a one step process or two-step process, as shown in FIG. 1 or FIGS. 2a and 2b, a platen adhesive may be applied to the multi-layer pad material. The platen adhesive may be a pressure sensitive adhesive (PSA) that provides a secure bond to the CMP pad but allows for easy removal from the polishing platen. The resulting multi-layer pad material, made by either method, is then collected and cut into sheets.

Figure 3:
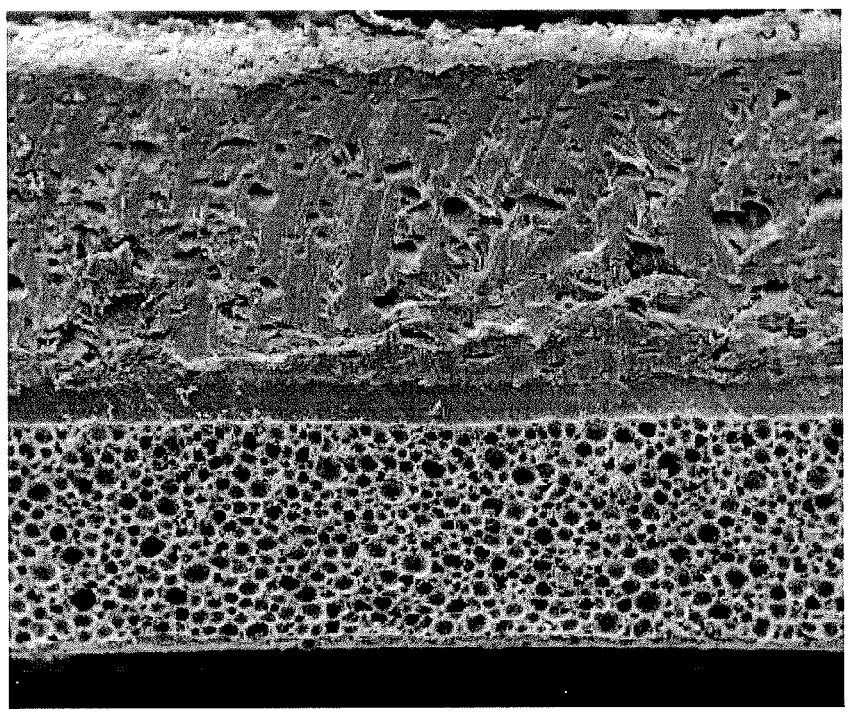
FIG. 3 depicts an SEM cross sectional view of an inventive pad.

FIG. 3 depicts a scanning electron microscopy (SEM) cross section of the interface of a multi-layered polishing pad of the present invention. In FIG. 3 the top layer, middle layer and bottom layer are bonded together without any breakage or free space between the layers.

The following examples further illustrate the invention but, of course, should not be construed as in any way limiting its scope.

EXAMPLE 1

This example illustrates a method of producing a multi-layer polishing pad of the invention using a two-step process.

A roll of polycarbonate (PC) material of 20 mil thickness is loaded on the upper un-wind station of a pilot scale laminator (AGL 6400 laminator, Advanced Greig Laminator, Inc., DeForest, Wis.). A roll of thermoplastic polyurethane, 6 mil thickness, representing the middle layer, is loaded on the lower un-wind. The polycarbonate sheet and the polyurethane sheet fed into the laminator and are joined together in the heated nip. The top roller, comprising chrome, is heated to 180° F., while the bottom roller, comprising silicone, is heated to 200° F. The resulting two-layer stacked intermediate material is collected on the rear re-wind station, creating a roll of the intermediate polycarbonate-polyurethane material. This intermediate roll is then loaded on the un-wind cart of a HVM laminator (Black Brother Company, Mendota, Ill.). The material is webbed such that the polycarbonate bottom layer is contacting the chrome (270° F.) roller, and the polyurethane middle layer will contact the top layer (polyurethane) under the unheated nip. Heat is transferred through the polycarbonate, heating the middle layer above its Vicat softening temperature. As the pad top layer sheet is fed into the nip, the softened middle layer bonds with the top sheet, thereby bonding the bottom layer and the top layer together with the middle layer.

EXAMPLE 2

This example sets forth the T-peel strength analysis of the pad materials of the present invention, compared to identical pad materials bonded together with a pressure sensitive adhesive.

The pads from the previous example were placed in a die press and three strips measuring 1 inch by 12 inches were cut from each pad. As a control, strips having the same dimension were prepared from pads comprising the identical top layer and bottom layer materials as the inventive pad, but having the layers bonded together using a pressure sensitive adhesive, were also tested. For each test strip, the bottom layer (i.e. the polycarbonate layer) was placed in the lower locking jaws of the load cell apparatus (Tinius Olsen model H10KT, Horsham, Pa.). The top layer was then placed in the upper jaws and the load cell apparatus, whereby the apparatus pulls the two layers apart using a controlled speed and force, and the time and pressure (lbs.) at failure is recorded.

Figure 4:
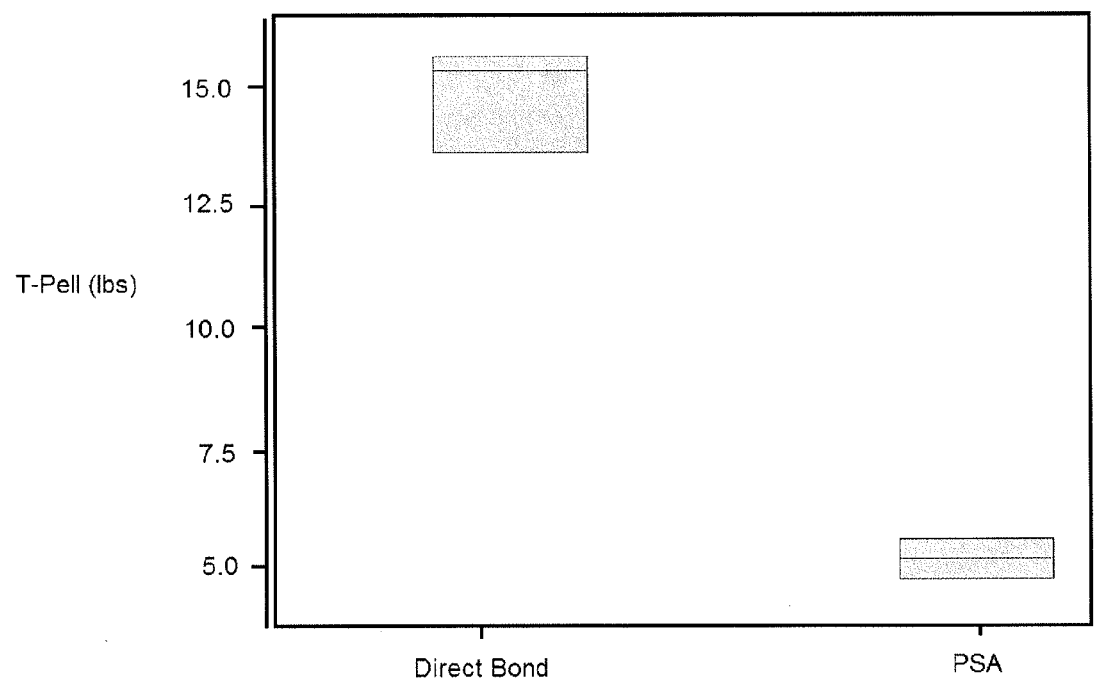
FIG. 4 depicts the results of a T-peel test for pad materials made from the inventive method compared to pad material made by bonding the layer together with an adhesive.

The results of the T-peel strength tests are shown in FIG. 4 as a box plot. The strips from the inventive pad (Direct Bond) show significantly stronger bond strength as compared to the control test strip having a pressure sensitive adhesive (PSA) bonding the top and bottom layers together.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A multi-layer polishing pad for chemical-mechanical polishing comprising a top layer, a middle layer and a bottom layer, wherein the top layer and the bottom layer are bonded together by the middle layer, and wherein the layers are bonded without the use of an adhesive, wherein the middle layer comprises a thermoplastic polyurethane, wherein the thermoplastic polyurethane of the middle layer has a lower Vicat softening temperature than the top layer or the bottom layer, and wherein the middle layer has a Vicat softening temperature between about 260° F. and about 300° F.

2. The polishing pad of claim 1, wherein the top layer comprises a polishing surface.

3. The polishing pad of claim 1, wherein the bottom layer comprises a polycarbonate material.

4. The polishing pad of claim 1, wherein the top layer comprises a polymer resin selected from the group consisting of a thermoplastic polyurethane, polycarbonates, nylons, polyolefins, polyvinylalcohols, polyacrylates, polytetrafluoroethylene, polyethyleneterephthalate, polyimides, polyarylenes, polyacrylates, polystyrenes, polymethylmethacrylates, copolymers thereof, and mixtures thereof.

5. The polishing pad of claim 4, wherein the polymer resin is a thermoplastic polyurethane.

6. The polishing pad of claim 1, wherein the thickness of the middle layer is from about 3 mil to about 5 mil.

7. The polishing pad of claim 1, wherein the top layer and the bottom layer are porous.

8. A chemical-mechanical polishing apparatus comprising:
   a platen that rotates,
   the polishing pad of claim 1 affixed to the rotating platen, and
   a carrier that holds a workpiece to be polished by contacting the rotating polishing pad.

9. The chemical-mechanical polishing apparatus of claim 8, further comprising an in situ endpoint detection system.

10. A method of polishing a workpiece comprising
    (i) providing the polishing pad of claim 1,
    (ii) contacting a workpiece with the polishing pad, and
    (iii) moving the polishing pad relative to the workpiece to abrade the workpiece and thereby polish the workpiece.

11. A method of producing a multi-layer polishing pad comprising the steps of (i) joining together multiple layers of polymer sheets comprising a top layer, a middle layer and a bottom layer, wherein the middle layer comprises a polymer resin having lower Vicat softening temperature as compared to the top layer and the bottom layer, (ii) subjecting the multi-layer polymer sheet to a temperature that is above the Vicat softening temperature of the middle layer but below the Vicat softening temperature of the top layer and the bottom layer, and (iii) forming a bond between the middle layer and the top layer, and a bond between the middle layer and the bottom layer, wherein the polymer resin comprises a thermoplastic polyurethane.

12. The method of claim 11, wherein the multi-layer polymer sheet is subjected to a temperature between about 260° F. and about 300° F.

13. The method of claim 12, wherein subjecting the multi-layer polymer sheet to a temperature between about 260° F. and about 300° F. is done by lamination.

14. The method of claim 11, wherein the bottom layer comprises a polycarbonate.

15. The method of claim 11, wherein the middle layer comprises a thermoplastic polyurethane.

16. The method of claim 11, wherein the top layer comprises a polymer resin selected from the group consisting of a thermoplastic polyurethane, polycarbonates, nylons, polyolefins, polyvinylalcohols, polyacrylates, polytetrafluoroethylene, polyethyleneterephthalate, polyimides, polyarylenes, polyacrylates, polystyrenes, polymethylmethacrylates, copolymers thereof, and mixtures thereof.

17. The method of claim 11, wherein the top layer and the bottom layer are porous.

* * * * *